United States Patent
Kawamura

(10) Patent No.: US 10,775,447 B2
(45) Date of Patent: Sep. 15, 2020

(54) GROUND FAULT DETECTION APPARATUS

(71) Applicant: Yazaki Corporation, Tokyo (JP)

(72) Inventor: Yoshihiro Kawamura, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 97 days.

(21) Appl. No.: 16/229,393

(22) Filed: Dec. 21, 2018

(65) Prior Publication Data
US 2019/0195931 A1    Jun. 27, 2019

(30) Foreign Application Priority Data

Dec. 25, 2017  (JP) ................. 2017-247243

(51) Int. Cl.
| | |
|---|---|
| G01R 31/02 | (2006.01) |
| B60L 3/00 | (2019.01) |
| G01R 31/00 | (2006.01) |
| G01R 31/14 | (2006.01) |
| G01R 31/50 | (2020.01) |

(52) U.S. Cl.
CPC ............ *G01R 31/50* (2020.01); *B60L 3/0069* (2013.01); *G01R 31/006* (2013.01); *G01R 31/14* (2013.01)

(58) Field of Classification Search
CPC ...... G01R 31/50; G01R 31/14; G01R 31/006; G01R 31/52; G01R 27/025; B60L 3/0069
See application file for complete search history.

(56) References Cited

U.S. PATENT DOCUMENTS

| | | | | |
|---|---|---|---|---|
| 2014/0214262 A1* | 7/2014 | Iwanabe | ............... | G01R 31/50 701/31.7 |
| 2015/0285851 A1* | 10/2015 | Kawamura | ........... | B60L 3/0069 324/509 |
| 2015/0293167 A1 | 10/2015 | Kawamura | | |
| 2018/0224493 A1* | 8/2018 | Kawamura | ............ | G01R 31/52 |

FOREIGN PATENT DOCUMENTS

JP          2015-206784 A       11/2015

* cited by examiner

*Primary Examiner* — Alvaro E Fortich
*Assistant Examiner* — Zannatul Ferdous
(74) *Attorney, Agent, or Firm* — Sughrue Mion, PLLC

(57) ABSTRACT

A ground fault detection apparatus includes a detection capacitor, termination resistors on positive- and negative-electrode sides, bypass resistors on positive- and negative-electrode sides, a bypass twin relay, twin relays on positive- and negative-electrode sides, and a control unit configured to compare a first full-charge voltage obtained with the positive-electrode-side twin relay in a first state, the negative-electrode-side twin relay in a second state and the bypass twin relay in a first state, with a second full-charge voltage obtained with the positive-electrode-side twin relay in a second state, the negative-electrode-side twin relay in a first state and the bypass twin relay in the first state, and determines that negative-electrode-side insulation resistance is lowered when the second full-charge voltage is smaller and when degree of the smallness is great.

8 Claims, 11 Drawing Sheets

GROUND FAULT DETECTION APPARATUS

GROUND FAULT DETECTION APPARATUS

GROUND FAULT DETECTION APPARATUS

GROUND FAULT DETECTION APPARATUS

Vp MEASUREMENT

Vn MEASUREMENT

Vpp MEASUREMENT

Vnn MEASUREMENT

GROUND FAULT DETECTION APPARATUS

FIELD OF THE INVENTION

The present invention relates to a ground fault detection apparatus using a flying capacitor.

BACKGROUND

In a vehicle such as a hybrid car, which includes an engine and an electric motor as driving sources, and an electric vehicle, a battery mounted on a vehicle body is charged, and driving power is generated with use of electric energy supplied from the battery. In general, a power supply circuit related to the battery is configured as a high-voltage circuit using as high voltage as 200V or higher, and for ensuring safety, the high-voltage circuit including the battery is in an ungrounded configuration in which the high-voltage circuit is electrically insulated from a vehicle body serving as a reference potential point of a ground.

In the vehicle mounted with the ungrounded high-voltage battery, a ground fault detection apparatus is provided to monitor an insulating (ground fault) state between the vehicle body and a system provided with the high-voltage battery, specifically, a main power supply system ranging from the high-voltage battery to a motor. As the ground fault detection apparatus, one of a type using a capacitor called a flying capacitor is widely used.

FIG. 11 illustrates a circuit example of a conventional ground fault detection apparatus of the flying capacitor type. As illustrated in FIG. 7, a ground fault detection apparatus 400 is connected to an ungrounded high-voltage battery 300 to detect a ground fault of a system provided with the high-voltage battery 300. In this apparatus, insulation resistance between a positive-electrode side of the high-voltage battery 300 and a ground is referred to as RLp, and insulation resistance between a negative-electrode side and the ground is referred to as RLn.

As illustrated in FIG. 7, the ground fault detection apparatus 400 includes a detection capacitor C1 operated as the flying capacitor. The ground fault detection apparatus 400 also includes four switches S1 to S4 around the detection capacitor C1 to switch a measurement path and control charge/discharge of the detection capacitor C1. The ground fault detection apparatus 400 further includes a switch Ss configured to sample voltage for measurement corresponding to charge voltage of the detection capacitor C1.

To figure out the insulation resistance RLp and RLn, the ground fault detection apparatus 400 repeats a measurement operation with one cycle including V0 measurement period→Vc1$n$ measurement period→V0 measurement period→Vc1$p$ measurement period. In any of the measurement periods, the detection capacitor C1 is charged with voltage to be measured, and charge voltage of the detection capacitor C1 is then measured. The detection capacitor C1 is then discharged for the subsequent measurement.

In the V0 measurement period, voltage corresponding to voltage of the high-voltage battery 300 is measured. Thus, the switches S1 and S2 are turned on, the switches S3 and S4 are turned off, and the detection capacitor C1 is charged. That is, the high-voltage battery 300, a resistor R1, the detection capacitor C1, and a resistor R2 constitute the measurement path.

At the time of measurement of charge voltage of the detection capacitor C1, the switches S1 and S2 are turned off, the switches S3 and S4 are turned on, the switch Ss is turned on, and sampling is performed in a control unit 420. Thereafter, the detection capacitor C1 is discharged for the subsequent measurement. Operations at the time of measurement of charge voltage of the detection capacitor C1 and at the time of discharge of the detection capacitor C1 are similar in the other measurement periods.

In the Vc1$n$ measurement period, voltage on which an influence of the insulation resistance RLn is reflected is measured. Thus, the switches S1 and S4 are turned on, the switches S2 and S3 are turned off, and the detection capacitor C1 is charged. That is, the high-voltage battery 300, the resistor R1, the detection capacitor C1, a resistor R4, a ground, and the insulation resistor RLn constitute the measurement path.

In the Vc1$p$ measurement period, voltage on which an influence of the insulation resistance RLp is reflected is measured. Thus, the switches S2 and S3 are turned on, the switches S1 and S4 are turned off, and the detection capacitor C1 is charged. That is, the high-voltage battery 300, the insulation resistor RLp, the ground, a resistor R5, the detection capacitor C1, and the resistor R2 constitute the measurement path.

It is known that, $(RLp \times RLn)/(RLp+RLn)$ can be derived based on $(Vc1p+Vc1n)/V0$ calculated from V0, Vc1$n$, and Vc1$p$ obtained in these measurement periods. Thus, the control unit 420 of the ground fault detection apparatus 400 can figure out the combined resistance of the insulation resistances RLp and RLn by measuring V0, Vc1$n$, and Vc1$p$. If the combined resistance of the insulation resistances RLp and RLn is equal to or less than a predetermined determination reference level, then the control unit 420 determines that a ground fault is occurring and outputs a warning.

Meanwhile, in each of the measurement periods, when the detection capacitor C1 is fully charged, a voltage value of the high-voltage battery 300 is obtained in the V0 measurement period, and values obtained by dividing the high-voltage battery 300 by the insulation resistance RLp, RLn are just derived in the Vc1$n$ measurement period and the Vc1$p$ measurement period. The insulation resistance cannot be calculated by the above equation. For this reason, charge time in each of the measurement periods is set to be the time by which the detection capacitor C1 is charged for about 50%, for example.

CITATION LIST

Patent Literature

Patent Literature 1: JP 2015-206784 A

SUMMARY OF THE INVENTION

In general, capacitors CYp and CYn, each called a Y capacitor (line bypass capacitor), are connected between a positive-electrode-side power supply line 301 of the high-voltage battery 300 and a ground electrode, and between a negative-electrode-side power supply line 302 and the ground electrode, to eliminate radio-frequency noise of the power supply and to stabilize the operation. Particularly, when the high-voltage battery 300 is connected to a high-voltage facility such as a charging facility, the high-capacity Y capacitors are connected.

When the high-capacity Y capacitors are connected, electric charges accumulated in the Y capacitors will move to the detection capacitor C1 when performing each measurement in the ground fault detection apparatus 400, having an influence on a measurement value. If the capacity of the detection capacitor C1 is increased to alleviate such influence, then the charging speed will correspondingly be lowered, and the measurement time will correspondingly be extended which is undesired.

Furthermore, in the conventional ground fault detection apparatus 400, the switches S1-S4 are constituted of four optical MOS-FETs as insulated switching elements. Thus, there is another problem that the use of the expensive optical MOS-FET causes increase in cost of the ground fault detection apparatus.

An object of the present invention is to provide a ground fault detection apparatus which can suppress increase in cost due to switching elements and which can deal with a high-capacity Y capacitor.

To achieve the above-mentioned object, the present invention according to a first aspect provides a ground fault detection apparatus connected to a high-voltage battery and configured to detect lowering of insulation resistance of a system provided with the high-voltage battery, the ground fault detection apparatus including: (a) a detection capacitor which operates as a flying capacitor; (b) a positive-electrode-side termination resistor connecting a positive-electrode side of the high-voltage battery and a ground; (c) a negative-electrode-side termination resistor connecting a negative-electrode side of the high-voltage battery and the ground; (d) a positive-electrode-side bypass resistor having one end connected to the ground; (e) a negative-electrode-side bypass resistor having one end connected to the ground; (f) a positive-electrode-side Form C contact point switch configured to alternatively switch a connection destination of a first end of the detection capacitor between the positive-electrode side of the high-voltage battery and the ground side; (g) a negative-electrode-side Form C contact point switch configured to alternatively switch a connection destination of a second end of the detection capacitor between the negative-electrode side of the high-voltage battery and the ground side; (h) a positive-electrode-side bypass switch configured to switch a state of connection between the positive-electrode side of the high-voltage battery and the positive-electrode-side bypass resistor; (i) a negative-electrode-side bypass switch configured to switch a state of connection between the negative-electrode side of the high-voltage battery and the negative-electrode-side bypass resistor; and (j) a control unit, wherein the control unit is configured to: compare a first charge voltage (Vp) of the detection capacitor with a second charge voltage (Vn) of the detection capacitor, the first charge voltage (Vp) being obtained when the detection capacitor is fully charged under a condition where (i) the positive-electrode-side Form C contact point switch is switched to the positive-electrode side of the high-voltage battery, (ii) the negative-electrode-side Form C contact point switch is switched to the ground side, and (iii) the positive-electrode-side bypass switch and the negative-electrode-side bypass switch are in a non-connecting state, and the second charge voltage (Vn) being obtained when the detection capacitor is fully charged under a condition where (i) the positive-electrode-side Form C contact point switch is switched to the ground side, (ii) the negative-electrode-side Form C contact point switch is switched to the negative-electrode side of the high-voltage battery, and (iii) the positive-electrode-side bypass switch and the negative-electrode-side bypass switch are in the non-connecting state; and determine that the insulation resistance on the positive-electrode side is lowered when the first charge voltage (Vp) is smaller and when degree of the smallness of the first charge voltage (Vp) is greater than a predetermined reference, or determine that the insulation resistance on the negative-electrode side is lowered when the second charge voltage (Vn) is smaller and when degree of the smallness of the second charge voltage (Vn) is greater than a predetermined reference.

Further, the control unit may be configured to: when the degree of the smallness of the first charge voltage (Vp) or the second charge voltage (Vn), whichever is smaller, is not greater than the predetermined reference, measure a third charge voltage (Vpp) of the detection capacitor or a fourth charge voltage (Vnn) of the detection capacitor, the third charge voltage (Vpp) being obtained when the detection capacitor is fully charged under a condition where (i) the positive-electrode-side Form C contact point switch is switched to the positive-electrode side of the high-voltage battery, (ii) the negative-electrode-side Form C contact point switch is switched to the ground side, (iii) the positive-electrode-side bypass switch is in the non-connecting state, and (iv) the negative-electrode-side bypass switch is in a connecting state, and the fourth charge voltage (Vnn) being obtained when the detection capacitor is fully charged under a condition where (i) the positive-electrode-side Form C contact point switch is switched to the ground side, (ii) the negative-electrode-side Form C contact point switch is switched to the negative-electrode side of the high-voltage battery, (iii) the positive-electrode-side bypass switch is in a connecting state, and (iv) the negative-electrode-side bypass switch is in the non-connecting state; and, when a ratio of change from the first charge voltage (Vp) to the third charge voltage (Vpp) is smaller than a reference, or when a ratio of change from the second charge voltage (Vn) to the fourth charge voltage (Vnn) is smaller than a reference, determine that the insulation resistance is lowered on both electrodes.

Further, the positive-electrode-side Form C contact point switch, the negative-electrode-side Form C contact point switch, the positive-electrode-side bypass switch and the negative-electrode-side bypass switch may be constituted of a twin relay.

The present invention according to a second aspect provides a ground fault detection apparatus connected to a high-voltage battery and configured to detect lowering of insulation resistance of a system provided with the high-voltage battery, the ground fault detection apparatus including: (a) a detection capacitor which operates as a flying capacitor; (b) a positive-electrode-side termination resistor connecting a positive-electrode side of the high-voltage battery and a ground; (c) a negative-electrode-side termination resistor connecting a negative-electrode side of the high-voltage battery and the ground; (d) a positive-electrode-side bypass resistor having one end connected to the ground; (e) a negative-electrode-side bypass resistor having one end connected to the ground; (f) a bypass twin relay configured to: in a first state, make no connection between the positive-electrode side of the high-voltage battery and a predetermined positive-electrode-side connection point, and make no connection between the negative-electrode side of the high-voltage battery and a predetermined negative-electrode-side connection point; and in a second state, connect between the positive-electrode side of the high-voltage battery and the predetermined positive-electrode-side connection point, and connect between the negative-electrode side of the high-voltage battery and the predetermined negative-electrode-side connection point; (g) a positive-electrode-side twin relay configured to: in a first state, connect a first end of the detection capacitor to the positive-electrode side of the high-voltage battery, while making no connection between the predetermined positive-electrode-side connection point and the positive-electrode-side bypass resistor; and in a second state, connect the first end of the detection capacitor to the ground, and connect the predetermined positive-electrode-side connection point and the positive-electrode-side bypass resistor; (h) a negative-electrode-side twin relay configured to: in a first state, connect a second end of the detection capacitor to the negative-electrode side of the high-voltage battery, while making no connection between the predetermined negative-electrode-side connection point and the negative-electrode-side bypass resistor; and in a second state, connect the second end of the detection capacitor to the ground, and connect the predetermined negative-electrode-side connection point and the negative-electrode-side bypass resistor; and (i) a control unit, wherein the control unit is configured to: compare a first charge voltage (Vp) of the detection capacitor with a second charge voltage (Vn) of the detection capacitor, the first charge voltage (Vp) being obtained when the detection capacitor is fully charged under a condition where (i) the positive-electrode-side twin relay is in the first state, (ii) the negative-electrode-side twin relay is in the second state, and (iii) the bypass twin relay is in the first state, and the second charge voltage (Vn) being obtained when the detection capacitor is fully charged under a condition where (i) the positive-electrode-side twin relay is in the second state, (ii) the negative-electrode-side twin relay is in the first state, and (iii) the bypass twin relay is in the first state; and determine that the insulation resistance on the positive-electrode side is lowered when the first charge voltage (Vp) is smaller and when degree of the smallness of the first charge voltage (Vp) is greater than a predetermined reference, or determine that the insulation resistance on the negative-electrode side is lowered when the second charge voltage (Vn) is smaller and when degree of the smallness of the second charge voltage (Vn) is greater than a predetermined reference.

Further, the control unit is configured to: when the degree of the smallness of the first charge voltage (Vp) or the second charge voltage (Vn), whichever is smaller, is not greater than the predetermined reference, measure a third charge voltage (Vpp) of the detection capacitor or a fourth charge voltage (Vnn) of the detection capacitor, the third charge voltage (Vpp) being obtained when the detection capacitor is fully charged under a condition where (i) the positive-electrode-side twin relay is in the first state, (ii) the negative-electrode-side twin relay is in the second state, and (iii) the bypass twin relay is in the second state, and the fourth charge voltage (Vnn) being obtained when the detection capacitor is fully charged under a condition where (i) the positive-electrode-side twin relay is in the second state, (ii) the negative-electrode-side twin relay is in the first state, and (iii) the bypass twin relay is in the second state; and, when a ratio of change from the first charge voltage (Vp) to the third charge voltage (Vpp) is smaller than a reference, or when a ratio of change from the second charge voltage (Vn) to the fourth charge voltage (Vnn) is smaller than a reference, determine that the insulation resistance is lowered on both electrodes.

In the ground fault detection apparatus according to the first or second aspect, the control unit may be configured to: when the degree of the smallness of the first charge voltage (Vp) or the second charge voltage (Vn), whichever is smaller, is not greater than the predetermined reference, measure the third charge voltage (Vpp) when the first charge voltage (Vp) is smaller, or measure the fourth charge voltage (Vnn) when the second charge voltage (Vn) is smaller.

According to the present invention described above, a ground fault detection apparatus which can suppress increase in cost due to switching elements and which can deal with a high-capacity Y capacitor can be provided.

DETAILED DESCRIPTION OF EXEMPLARY EMBODIMENTS

Figure 1:
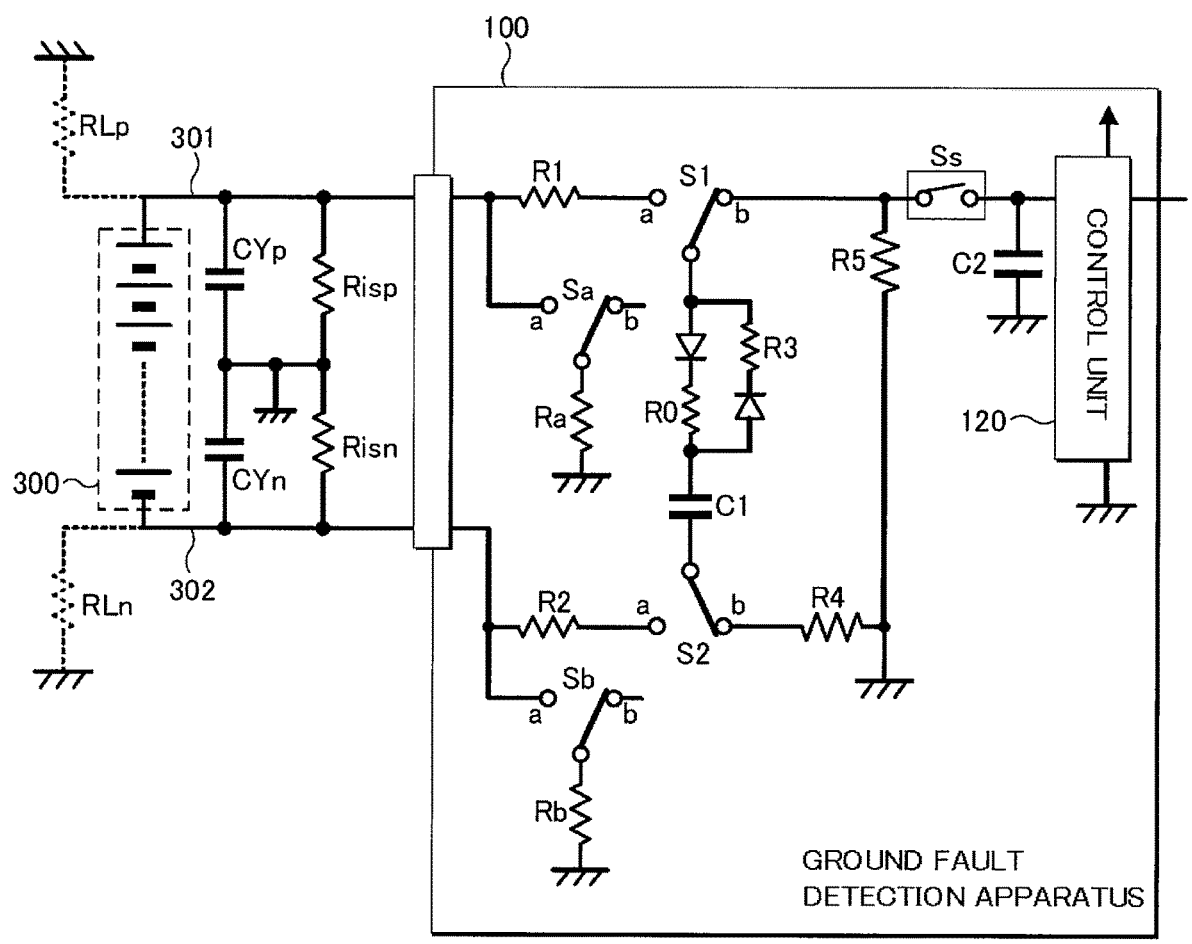
FIG. 1 is a block diagram illustrating a configuration of a ground fault detection apparatus according to a first embodiment of the present invention.

An embodiment of the present invention will be described in detail with reference to the drawings. FIG. 1 is a block diagram illustrating a configuration of a ground fault detection apparatus 100 according to a first embodiment of the present invention. As shown, the ground fault detection apparatus 100 is a flying capacitor type apparatus connected to a high-voltage battery 300 to detect a ground fault of a system provided with the high-voltage battery 300. Herein, insulation resistance between a positive-electrode side of the high-voltage battery 300 and a ground is indicated by RLp, and insulation resistance between a negative-electrode side of the high-voltage battery 300 and the ground is indicated by RLn.

The high-voltage battery 300 is a battery used to drive a vehicle and cause the vehicle to travel. The high-voltage battery 300 is constituted of a chargeable battery such as a lithium ion battery, and is configured to discharge via a not-illustrated bus bar and to drive an electric motor connected via an inverter or the like. Also, at the time of regeneration or connection to a charging facility, charging is performed via the bus bar.

In general, capacitors CYp and CYn each so-called as a Y capacitor (line bypass capacitor) are connected between a positive-electrode-side power supply line 301 of the high-voltage battery 300 and a ground electrode and between a negative-electrode-side power supply line 302 and the ground electrode, respectively, to eliminate radio-frequency noise of the power supply and stabilize the operation.

As illustrated in FIG. 1, the ground fault detection apparatus 100 includes a detection capacitor C1 which operates as a flying capacitor, and a control unit 120 constituted of a microcomputer and such. The control unit 120 performs various controls necessary in the ground fault detection apparatus 100 such as a later-described switching process by executing a pre-incorporated program.

Further, the ground fault detection apparatus 100 includes a switch Ss for sampling voltage for measurement corresponding to a charge voltage of the detection capacitor C1. One end of the switch Ss is connected to one end of a capacitor C2 and to an analog input terminal of the control unit 120. The other end of the capacitor C2 is grounded. Alternatively, the function of the switch Ss may be provided inside the control unit 120.

The control unit 120 controls the switch Ss to input an analog level corresponding to the charge voltage of the detection capacitor C1 from the analog input terminal and, based on this analog level, detects lowering of insulation resistance of the system provided with the high-voltage battery 300.

To switch a measurement path and to control charge and discharge of the detection capacitor C1, the ground fault detection apparatus 100 of the first embodiment includes four Form C contact point switches (a positive-electrode-side charge/discharge switch S1, a negative-electrode-side charge/discharge switch S2, a positive-electrode-side bypass switch Sa and a negative-electrode-side bypass switch Sb). Each Form C contact point switch (S1, S2, Sa, Sb) may be constituted of a high breakdown voltage and low signal mechanical relay or reed relay, for example. As will be described later, since each of the positive-electrode-side bypass switch Sa and the negative-electrode-side bypass switch Sb is configured to be "open" at a contact point "b", it may not necessarily be the Form C contact point switch, but may be constituted of a normal mechanical relay or reed relay or the like.

As described above, the ground fault detection apparatus 100 of the first embodiment does not use an optical MOSFET which causes increase in cost as the switch for switching the measurement path for ground fault detection. Thus, increase in cost due to the switching elements can be suppressed. This is the same for later-described embodiments.

In the ground fault detection apparatus 100, the positive-electrode-side power supply line 301 is connected to one end of a resistor R1 and to a contact point "a" of the positive-electrode-side bypass switch Sa. The contact point "b" of the positive-electrode-side bypass switch Sa is open, and a contact point "c" of the positive-electrode-side bypass switch Sa is grounded via a positive-electrode-side bypass resistor Ra.

The positive-electrode-side bypass resistor Ra has a resistance value that is sufficiently smaller than a value of the insulation resistance determined as the ground fault state. When the positive-electrode-side bypass resistor Ra is switched to the contact point "a", a positive-electrode-side bypass path is formed, allowing the positive-electrode-side power supply line 301 to be grounded via the positive-electrode-side bypass resistor Ra.

The other end of the resistor R1 is connected to a contact point "a" of the positive-electrode-side charge/discharge switch S1. A contact point "b" of the positive-electrode-side charge/discharge switch S1 is connected to the switch Ss and to one end of a resistor R5. The other end of the resistor R5 is grounded. A contact point "c" of the positive-electrode-side charge/discharge switch S1 is connected to a positive electrode plate of the detection capacitor C1 via parallel paths which are constituted of a path including a forward (i.e., a direction from the positive electrode to the negative electrode) diode and a resistor R0 and a path including a reverse diode and a resistor R3.

The negative-electrode-side power supply line 302 is connected to one end of a resistor R2 and to a contact point "a" of the negative-electrode-side bypass switch Sb. The contact point "b" of the negative-electrode-side bypass switch Sb is open, and a contact point "c" of the negative-electrode-side bypass switch Sb is grounded via a negative-electrode-side bypass resistor Rb.

The negative-electrode-side bypass resistor Rb has a resistance value that is sufficiently smaller than a value of the insulation resistance determined as the ground fault state. It is desirable that the negative-electrode-side bypass resistor Rb has the same resistance value as the positive-electrode-side bypass resistor Ra. When the negative-electrode-side bypass resistor Rb is switched to the contact point "a", a negative-electrode-side bypass path is formed, allowing the negative-electrode-side power supply line 302 to be grounded via the negative-electrode-side bypass resistor Rb.

The other end of the resistor R2 is connected to a contact point "a" of the negative-electrode-side charge/discharge switch S2. A contact point "b" of the negative-electrode-side charge/discharge switch S2 is grounded via a resistor R4 is grounded. A contact point "c" of the negative-electrode-side charge/discharge switch S2 is connected to a negative electrode plate of the detection capacitor C1.

The four Form C contact point switches (the positive-electrode-side charge/discharge switch S1, the negative-electrode-side charge/discharge switch S2, the positive-electrode-side bypass switch Sa and the negative-electrode-side bypass switch Sb) are independently switch-controlled by the control unit 120.

Furthermore, in each embodiment disclosed herein, a positive-electrode-side termination resistor Risp is connected between the positive-electrode-side power supply line 301 and the ground, and a negative-electrode-side termination resistor Risn is connected between the negative-electrode-side power supply line 302 and the ground. The positive-electrode-side termination resistor Risp and the negative-electrode-side termination resistor Risn have the same resistance values, each of which is sufficiently greater than a value of the insulation resistance determined as the ground fault.

Also, in this embodiment, the measurement is performed with the detection capacitor C1 in a fully charged state. Even if the high-capacity Y capacitors (CYp and CYn) are connected, the detection capacitor C1 does not need to have a high capacity, and thus full-charge time for the measurement can be shortened. Also, as described below, since voltage values of the high-voltage battery 300 divided by resistors are measured, one does not need to wait until the Y capacitors are stabilized.

Figure 2:
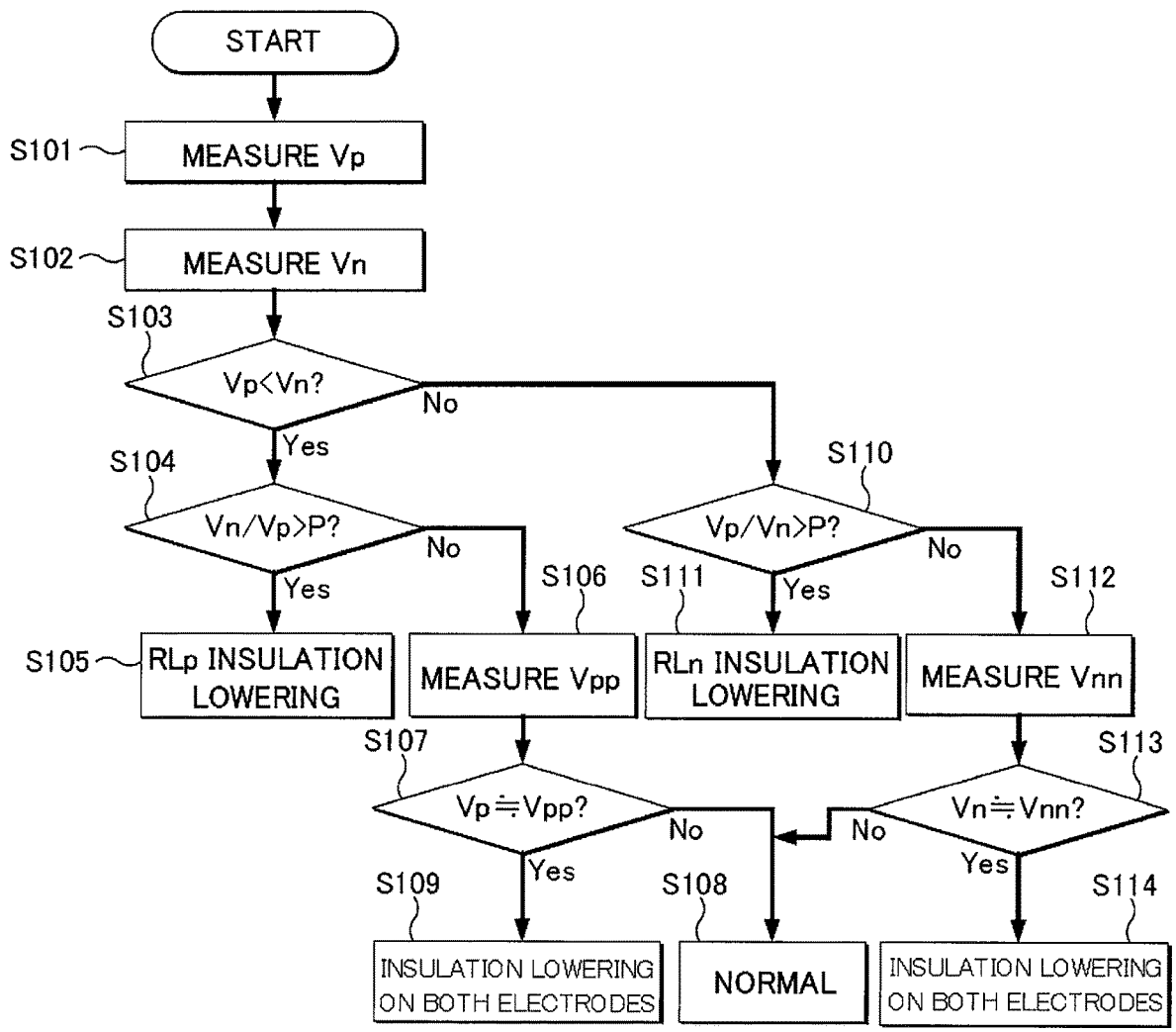
FIG. 2 is a flowchart illustrating an operation of the ground fault detection apparatus.

Next, operation of the ground fault detection apparatus 100 configured as described above will be described with reference to the flowchart of FIG. 2. As described above, in this embodiment, the measurement is performed with the detection capacitor C1 in a fully charged state. Thus, a ground fault determination is performed in a different method from a conventional insulation resistance calculation method.

Figure 3A:
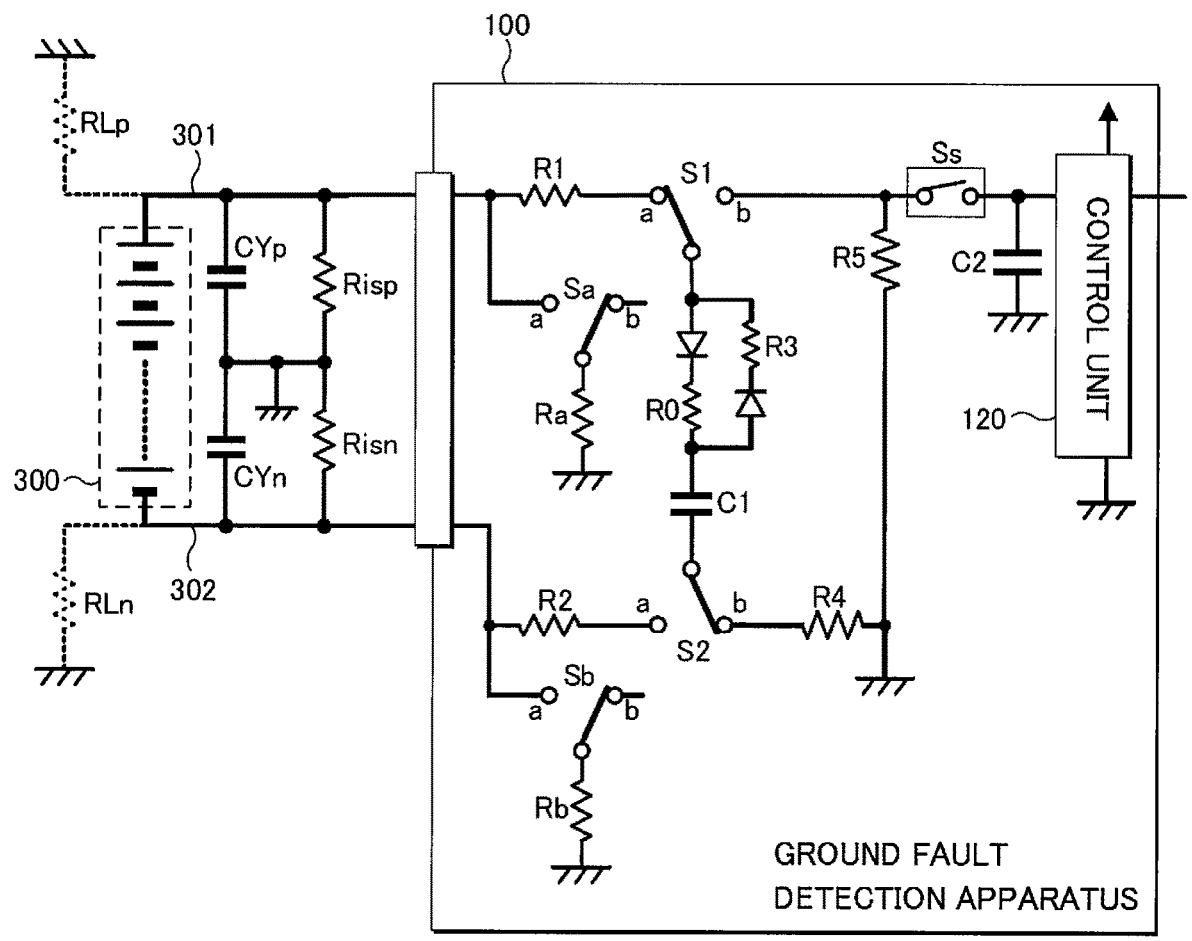
FIGS. 3A and 3B illustrate Vp measurement.

Firstly, as shown in FIG. 3A, the positive-electrode-side charge/discharge switch S1 is switched to the contact point "a" to be connected to the positive-electrode-side power supply line 301, and the negative-electrode-side charge/discharge switch S2 is switched to the contact point "b" to be grounded. The positive-electrode-side bypass switch Sa and the negative-electrode-side bypass switch Sb are both switched to the contact point "b" so no bypass path is formed with the positive-electrode-side power supply line 301 or the negative-electrode-side power supply line 302.

Figure 3B:
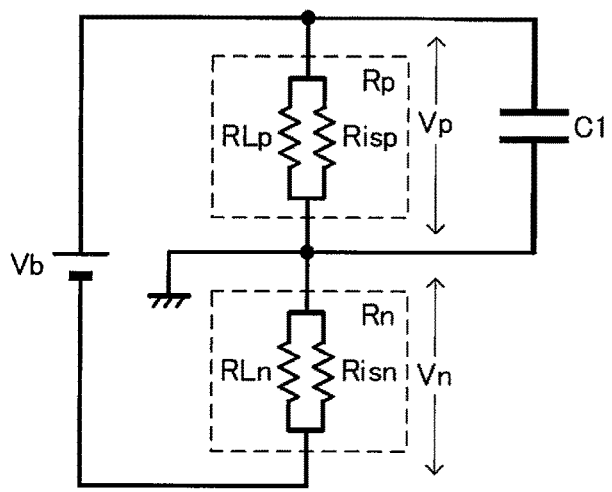

In this condition, the detection capacitor C1 is fully charged, and then the charge voltage Vp is measured (S101). Here, as illustrated in FIG. 3B, the charge voltage Vp corresponds to a voltage generated in a resistor Rp when a voltage Vb of the high-voltage battery 300 is divided by the resistor Rp and a resistor Rn. Here, the resistance Rp is parallel combined resistance of the positive-electrode-side termination resistance Risp and the positive-electrode-side insulation resistance RLp, and the resistance Rn is parallel combined resistance of the negative-electrode-side termination resistance Risn and the negative-electrode-side insulation resistance RLn.

When measuring the charge voltage Vp of the detection capacitor C1, the positive-electrode-side charge/discharge switch S1 and the negative-electrode-side charge/discharge switch S2 are both switched to the contact point "b" side, and the switch Ss is turned on. After the measurement, the switch Ss is turned off, and the detection capacitor C1 is discharged mainly through the resistor R5 for the next measurement. The operations in the measurement of the charge voltage of the detection capacitor C1 and in the discharge of the detection capacitor C1 are similar in measurement with other paths.

Figure 4A:
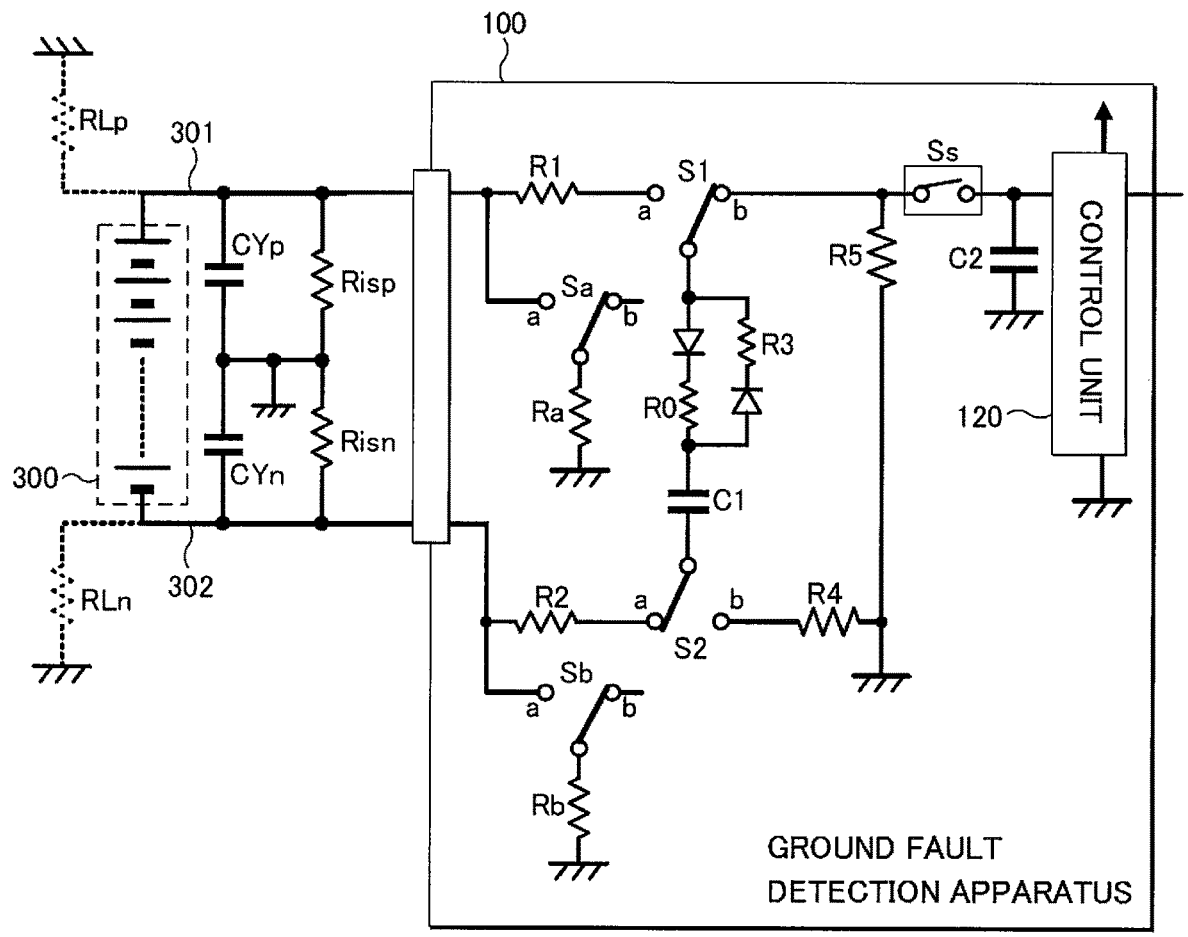
FIGS. 4A and 4B illustrate Vn measurement.

Next, as shown in FIG. 4A, the positive-electrode-side charge/discharge switch S1 is switched to the contact point "b" side to connect to a ground, and the negative-electrode-side charge/discharge switch S2 is switched to the contact point "a" side to connect to the negative-electrode-side power supply line 302. The positive-electrode-side bypass switch Sa and the negative-electrode-side bypass switch Sb are both switched to the contact point "b" side so no bypass path is formed with the positive-electrode-side power supply line 301 or the negative-electrode-side power supply line 302.

Figure 4B:
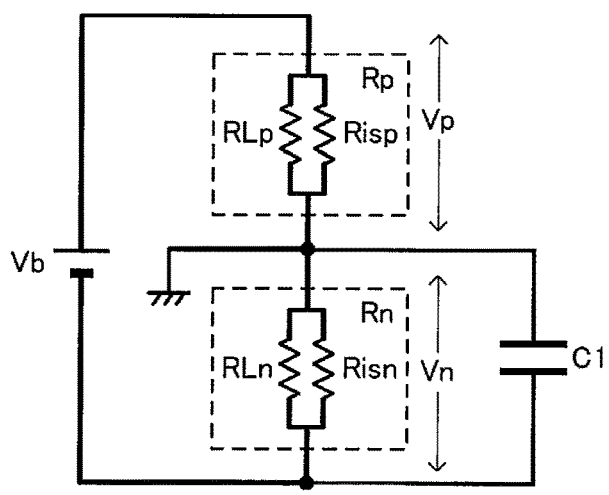

Under this condition, the detection capacitor C1 is fully charged, and charge voltage Vn at this time is measured (S102). Here, as illustrated in FIG. 4B, the charge voltage Vn corresponds to voltage generated in the resistor Rn when the voltage Vb of the high-voltage battery 300 is divided by the resistor Rp and the resistor Rn. The order of the measurement of the charge voltage Vn and the measurement of the charge voltage Vp may be selected arbitrarily.

When the charge voltage Vp is smaller than the charge voltage Vn (S103: Yes), and when the degree of this smallness is greater than a predetermined reference, such as when Vn/Vp>reference value P (S104: Yes), it is determined that the positive-electrode-side insulation resistance RLp is lowered (S105).

The supportable reason is described below. That is, since the positive-electrode-side termination resistance Risp and the negative-electrode-side termination resistance Risn have the same resistance values, if the charge voltage Vp is smaller than the charge voltage Vn, this means that the positive-electrode-side insulation resistance RLp is smaller than the negative-electrode-side insulation resistance RLn, and, as the degree of this smallness is greater, the positive-electrode-side insulation resistance RLp is deemed to be more lowered.

Similarly, when the charge voltage Vn is smaller than the charge voltage Vp (S103: No), and when the degree of this smallness is greater than a predetermined reference, such as when Vp/Vn>reference value P (S110: Yes), t is determined that the negative-electrode-side insulation resistance RLn is lowered (S111).

If the difference between the charge voltage Vp and the charge voltage Vn is relatively small, then it is possible, although the possibility is small, that the positive-electrode-side insulation resistance RLp and the negative-electrode-side insulation resistance RLn are lowered with the same degree. Thus, when the charge voltage Vp is smaller than the charge voltage Vn (S103: Yes) and when the difference between the charge voltage Vp and the charge voltage Vn is relatively small, such as when Vn/Vp reference value P (S104: No), the following process is performed.

Figure 5A:
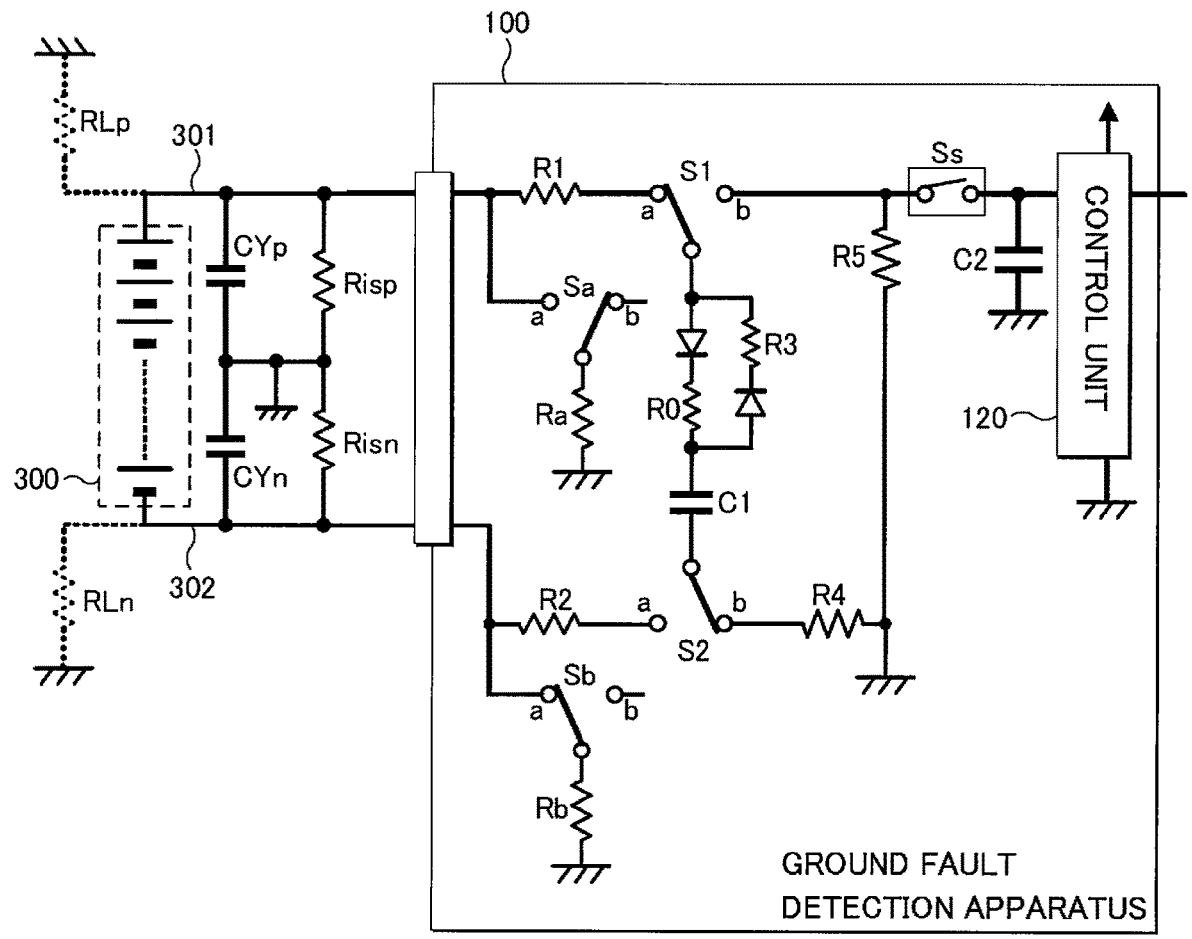
FIGS. 5A and 5B illustrate Vpp measurement.

That is, as shown in FIG. 5A, the positive-electrode-side charge/discharge switch S1 is switched to the contact point "a" side to connect to the positive-electrode-side power supply line 301, and the negative-electrode-side charge/discharge switch S2 is switched to the contact point "b" side to connect to a ground. With the positive-electrode-side bypass switch Sa kept on the contact point "b" side, the negative-electrode-side bypass switch Sb is switched to the contact point "a" side to form the negative-electrode-side bypass path.

Figure 5B:
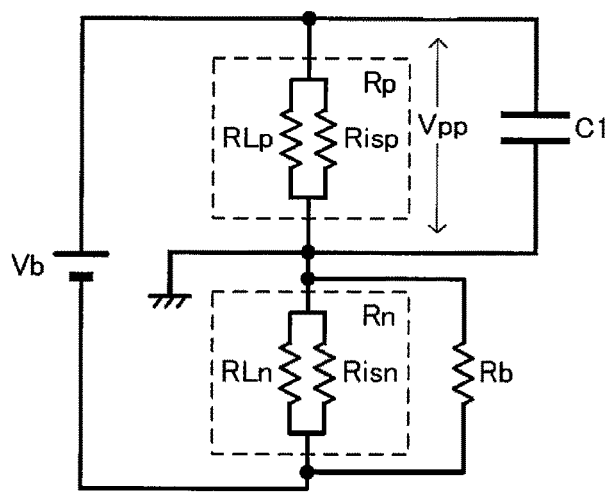

Under this condition, the detection capacitor C1 is fully charged and charge voltage Vpp at this time is measured (S106). Here, as illustrated in FIG. 5B, the charge voltage Vpp corresponds to voltage generated in the resistor Rp when voltage Vb of the high-voltage battery 300 is divided by the resistor Rp and a parallel combined resistor of the resistor Rn and the resistor R2. As described above, the resistor Rb has a resistance value that is sufficiently smaller than the insulation resistance value determined as the ground fault state.

If the charge voltage Vp and the charge voltage Vpp are regarded as approximately equal values, for example if a ratio of change (Vp/Vpp) from the charge voltage Vp to the charge voltage Vpp is smaller than the reference value (S107: Yes), meaning that an influence of the inserted resistor Rb is small, then it is determined that both the positive-electrode-side insulation resistance RLp and the negative-electrode-side insulation resistance RLn are lowered (S109).

On the other hand, if the charge voltage Vp and the charge voltage Vpp are not regarded as approximately equal values, for example if the ratio of change from the charge voltage Vp to the charge voltage Vpp is greater than the reference value (S107: No), meaning that an influence of the inserted resistor Rb is great, then it is determined that neither the positive-electrode-side insulation resistance RLp nor the negative-electrode-side insulation resistance RLn is lowered, and that the state is normal (S108).

Similarly, when the charge voltage Vn is smaller than the charge voltage Vp (S103: No), and when the difference between the charge voltage Vp and the charge voltage Vn is relatively small, such as when Vp/Vn<reference value P (S110: No), the following process is performed.

Figure 6A:
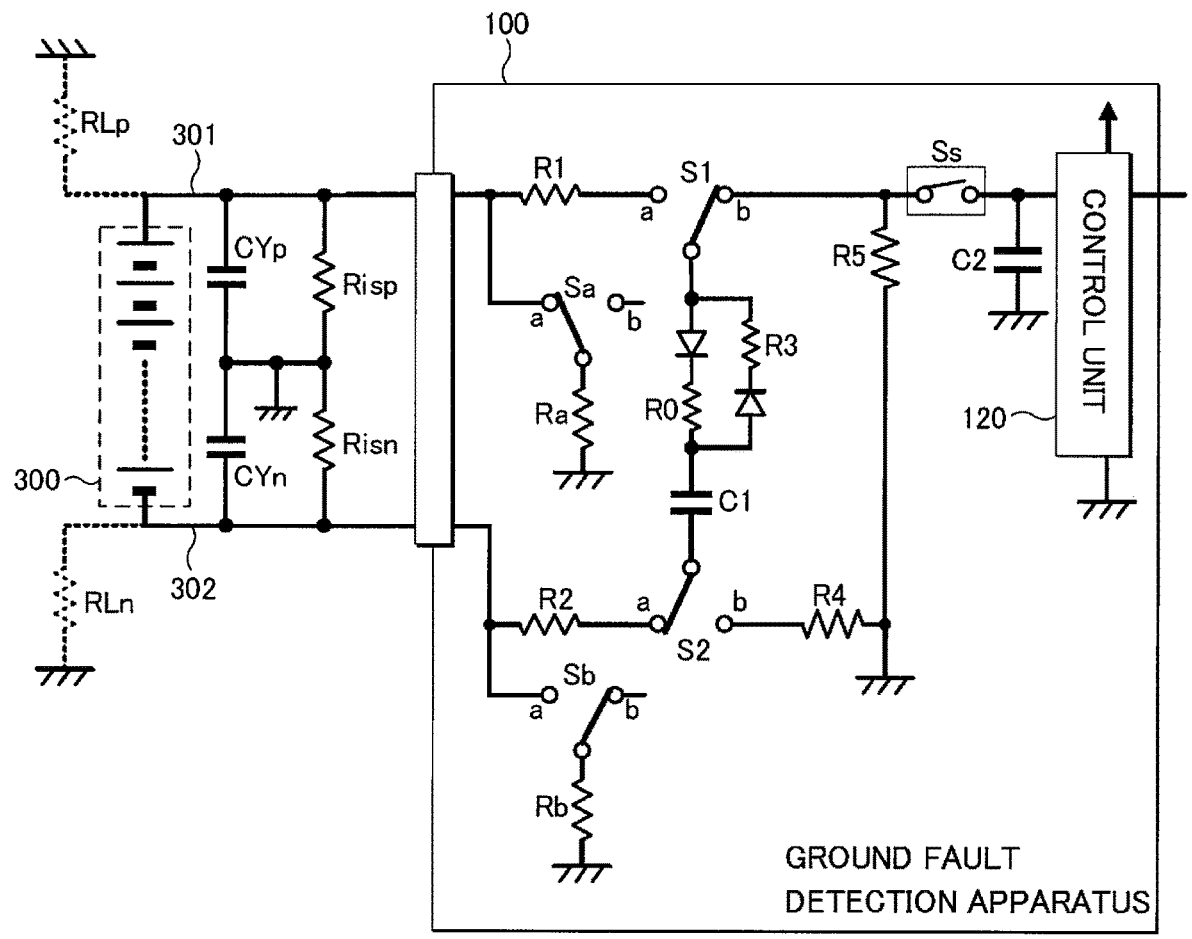
FIGS. 6A and 6B illustrate Vnn measurement.

That is, as shown in FIG. 6A, the positive-electrode-side charge/discharge switch S1 is switched to the contact point "b" side to connect to a ground, and the negative-electrode-side charge/discharge switch S2 is switched to the contact point "a" side to connect to the negative-electrode-side power supply line 302. With the negative-electrode-side bypass switch Sb kept on the contact point "b" side, the positive-electrode-side bypass switch Sa is switched to the contact point "a" side to form the positive-electrode-side bypass path.

Figure 6B:
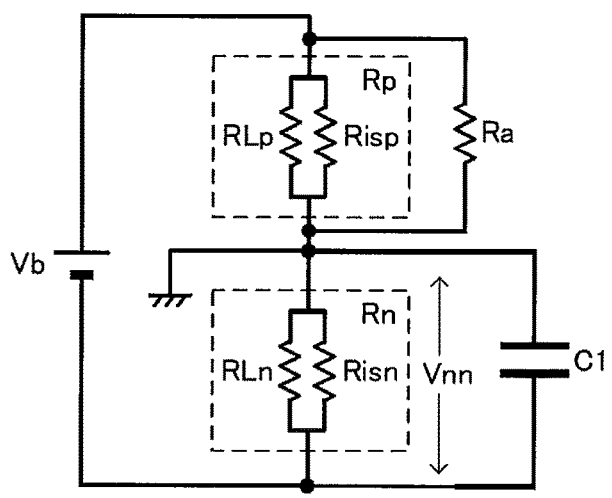

Under this condition, the detection capacitor C1 is fully charged and charge voltage Vnn at this time is measured (S112). Here, as illustrated in FIG. 6B, the charge voltage Vnn corresponds to voltage generated in the resistor Rn when voltage Vb of the high-voltage battery 300 is divided by a parallel combined resistor of the resistor Rp and the resistor Ra, and the resistor Rn. As described above, the resistor Ra has a resistance value that is sufficiently smaller than the insulation resistance value determined as the ground fault state.

If the charge voltage Vn and the charge voltage Vnn are regarded as approximately equal values, for example if a ratio of change (Vn/Vnn) from the charge voltage Vn to the charge voltage Vnn is smaller than the reference value (S113: Yes), meaning that an influence of the inserted resistor Ra is small, then it is determined that both the positive-electrode-side insulation resistance RLp and the negative-electrode-side insulation resistance RLn are lowered (S114).

On the other hand, if the charge voltage Vn and the charge voltage Vnn are not regarded as approximately equal values, for example if the ratio of change from the charge voltage Vn to the charge voltage Vnn is greater than the reference value (S113: No), meaning that an influence of the inserted resistor Ra is great, then it is determined that neither the positive-electrode-side insulation resistance RLp nor the negative-electrode-side insulation resistance RLn is lowered, and that the state is normal (S108).

In the above-described example, when the difference between the charge voltage Vp and the charge voltage Vn is relatively small, the charge voltage Vpp is measured when the charge voltage Vp is smaller, and the charge voltage Vnn is measured when the charge voltage Vn is smaller. The reason for this is to determine the ratio of change of the charge voltage when the resistor Rb or the resistor Ra is connected in parallel with the positive-electrode-side insulation resistance RLp or the negative-electrode-side insulation resistance RLn, whichever is greater. However, when the relative difference is small regardless of the great/small relationship between the charge voltage Vp and the charge voltage Vn, either the charge voltage Vpp or the charge voltage Vnn may be measured to make the determination of the insulation lowering on both electrodes or of the normal state.

Figure 7:
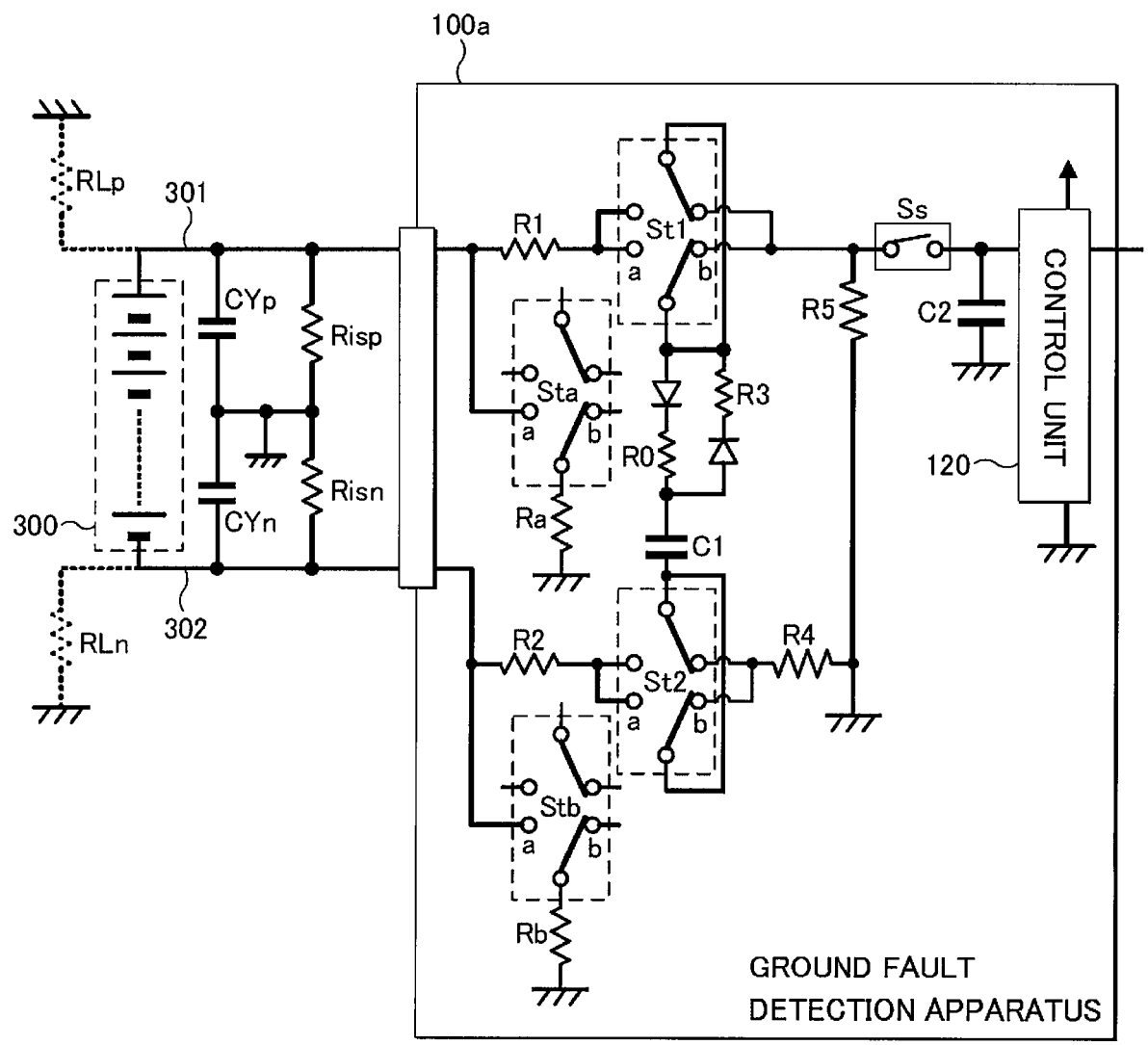
FIG. 7 is a block diagram illustrating a configuration of a ground fault detection apparatus according to a second embodiment of the present invention.

Next, a second embodiment of the present invention will be explained. FIG. 7 is a block diagram illustrating a configuration of a ground fault detection apparatus 100a according to the second embodiment. In the ground fault detection apparatus 100a of the second embodiment, each of the four Form C contact point switches is configured as a twin relay in which simultaneous switching is performed with a single control.

That is, a positive-electrode-side charge/discharge twin relay St1 is used in place of the positive-electrode-side charge/discharge switch S1, a negative-electrode-side charge/discharge twin relay St2 is used in place of the negative-electrode-side charge/discharge switch S2, a positive-electrode-side bypass twin relay Sta is used in place of the positive-electrode-side bypass switch Sa, and a negative-electrode-side bypass twin relay Stb is used in place of the negative-electrode-side bypass switch Sb. One example of the twin relay may include a twin relay with single coil and two Form C contact points.

Each of the positive-electrode-side charge/discharge twin relay St1 and the negative-electrode-side charge/discharge twin relay St2 is provided with paths in which current is parallely branched into respective relays in the twin relay. This can divide the flowing current into the respective relays, reducing the current load of the Form C contact point switch. The positive-electrode-side bypass twin relay Sta and the negative-electrode-side bypass twin relay St may also be configured to divide the current into the respective relays while being connected to the contact point "a".

In the second embodiment, the ground fault determination procedures and the switching operation for the measurements of the charge voltage Vp, the charge voltage Vn, the charge voltage Vpp and the charge voltage Vnn are the same as the first embodiment.

Figure 8:
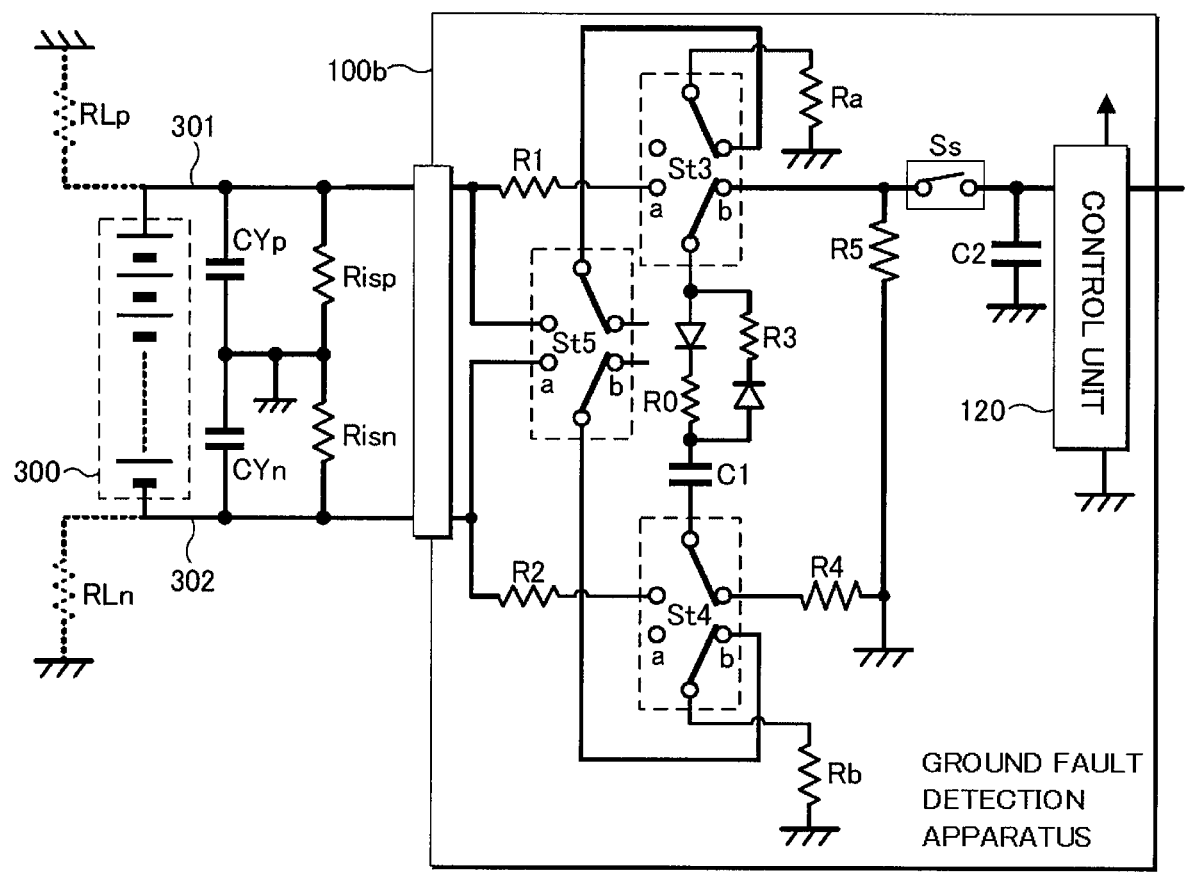
FIG. 8 is a block diagram illustrating a configuration of a ground fault detection apparatus according to a third embodiment of the present invention.

Next, a third embodiment of the present invention will be explained. FIG. 8 is a block diagram illustrating a configuration of a ground fault detection apparatus 100b according to the third embodiment. The ground fault detection apparatus 100b according to the third embodiment uses three twin relays (a positive-electrode-side twin relay St3, a negative-electrode-side twin relay St4, and a bypass twin relay St5), by which the number of twin relays can be reduced compared to the second embodiment. In the following, in each twin relay, one relay is referred to as a first relay, and the other relay which cooperates with the first relay is referred to as a second relay.

In the ground fault detection apparatus 100b according to the third embodiment, the positive-electrode-side power supply line 301 is connected to one end of the resistor R1 and to a contact point "a" of a first relay of the bypass twin relay St5. A contact point "b" of the first relay of the bypass twin relay St5 is open, and a contact point "c" of the first relay of the bypass twin relay St5 is connected to a contact point "b" of a first relay of the positive-electrode-side twin relay St3. A contact point "a" of the first relay of the positive-electrode-side twin relay St3 is open, and the contact point "c" of the first relay of the positive-electrode-side twin relay St3 is connected to a ground via the positive-electrode-side bypass resistor Ra.

The other end of the resistor R1 is connected to a contact point "a" of a second relay of the positive-electrode-side twin relay St3. A contact point "b" of the second relay of the positive-electrode-side twin relay St3 is connected to the switch Ss and to one end of the resistor R5. The other end of the resistor R5 is grounded. A contact point "c" of the second relay of the positive-electrode-side twin relay St3 is connected to the positive electrode plate of the detection capacitor C1 via the parallel paths which are constituted of the path including the forward diode and the resistor R0 and the path including the reverse diode and the resistor R3.

The negative-electrode-side power supply line 302 is connected to one end of the resistor R2 and to a contact point "a" of the second relay of the bypass twin relay St5. A contact point "b" of the second relay of the bypass twin relay St5 is open, and a contact point "c" of the second relay of the bypass twin relay St5 is connected to a contact point "b" of a first relay of the negative-electrode-side twin relay St4. A contact point "a" of the first relay of the negative-electrode-side twin relay St4 is open, and a contact point "c" of the first relay of the negative-electrode-side twin relay St4 is grounded via the negative-electrode-side bypass resistor Rb.

The other end of the of the resistor R2 is connected to a contact point "a" of a second relay of the negative-electrode-side twin relay St4. A contact point "b" of the second relay of the negative-electrode-side twin relay St4 is grounded via the resistor R4. A contact point "c" of the second relay of the negative-electrode-side twin relay St4 is connected to the negative electrode plate of the detection capacitor C1.

Figure 9A:
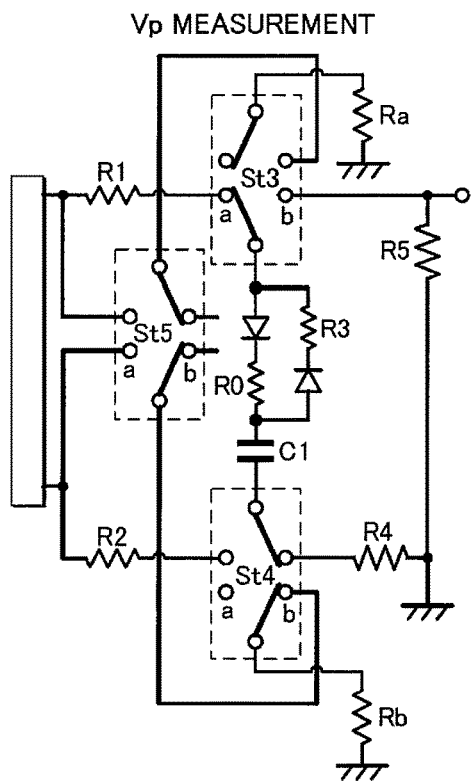
FIGS. 9A to 9D illustrate a measurement circuit of the ground fault detection apparatus according to the third embodiment of the present invention.

In the third embodiment, the ground fault determination procedures are the same as the first embodiment. FIGS. 9A to 9D illustrate switching operation in respective measurements according to the third embodiment, respectively. Specifically, as shown in FIG. 9A, at the time of measurement of the charge voltage Vp, the positive-electrode-side twin relay St3 is switched to the contact point "a", the negative-electrode-side twin relay St4 is switched to the contact point "b", and the bypass twin relay St5 is switched to the contact point "b". As a result, the circuit as shown in FIG. 3B can be formed.

Figure 9B:
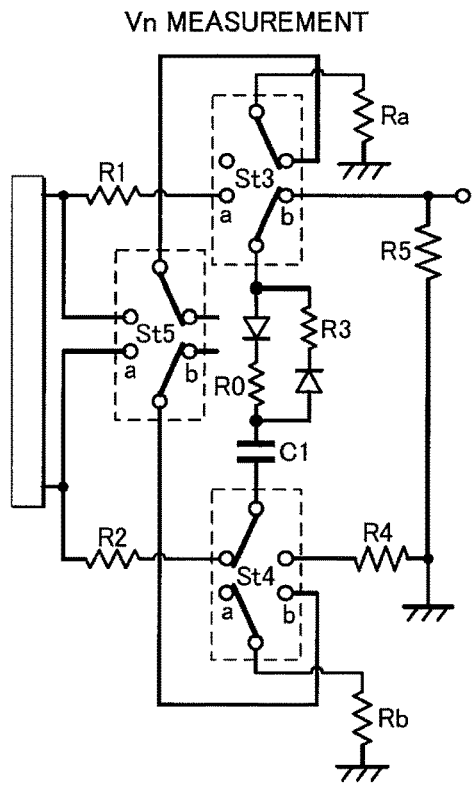

As shown in FIG. 9B, at the time of measurement of the charge voltage Vn, the positive-electrode-side twin relay St3 is switched to the contact point "b", the negative-electrode-side twin relay St4 is switched to the contact point "a", and the bypass twin relay St5 is switched to the contact point "b". As a result, the circuit as shown in FIG. 4B can be formed.

Figure 9C:
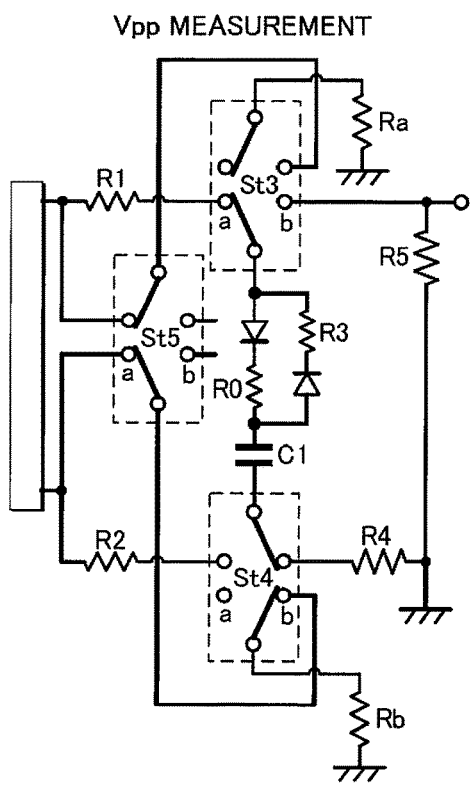

As shown in FIG. 9C, at the time of measurement of the charge voltage Vpp, the positive-electrode-side twin relay St3 is switched to the contact point "a", the negative-electrode-side twin relay St4 is switched to the contact point "b", and the bypass twin relay St5 is switched to the contact point "a". As a result, the circuit as shown in FIG. 5B can be formed.

Figure 9D:
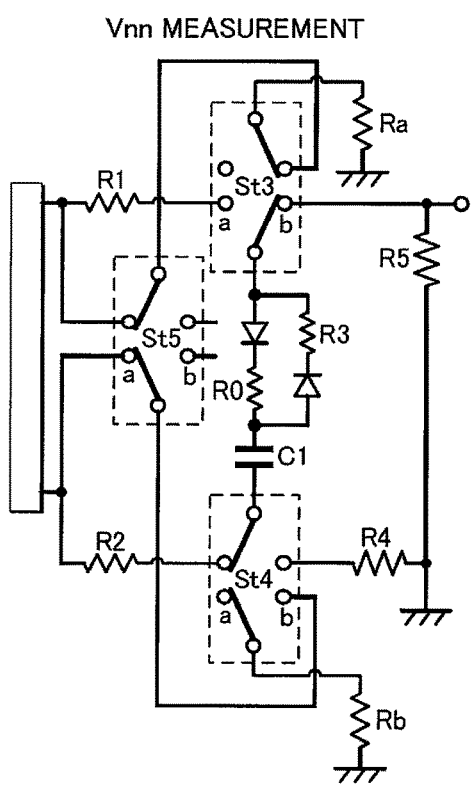

As shown in FIG. 9D, at the time of measurement of the charge voltage Vnn, the positive-electrode-side twin relay St3 is switched to the contact point "b", the negative-electrode-side twin relay St4 is switched to the contact point "a", and the bypass twin relay St5 is switched to the contact point "a". As a result, the circuit as shown in FIG. 6B can be formed.

Figure 10:
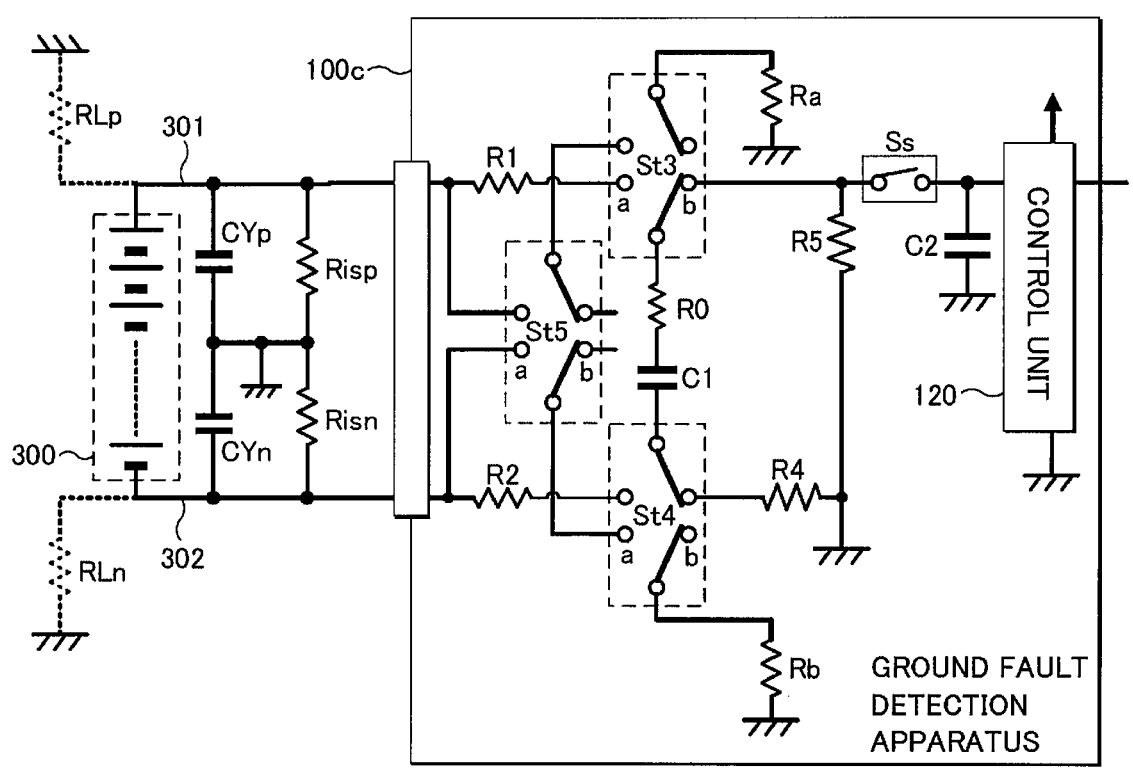
FIG. 10 is a block diagram illustrating a configuration of a ground fault detection apparatus according to a fourth embodiment of the present invention.
Figure 11:
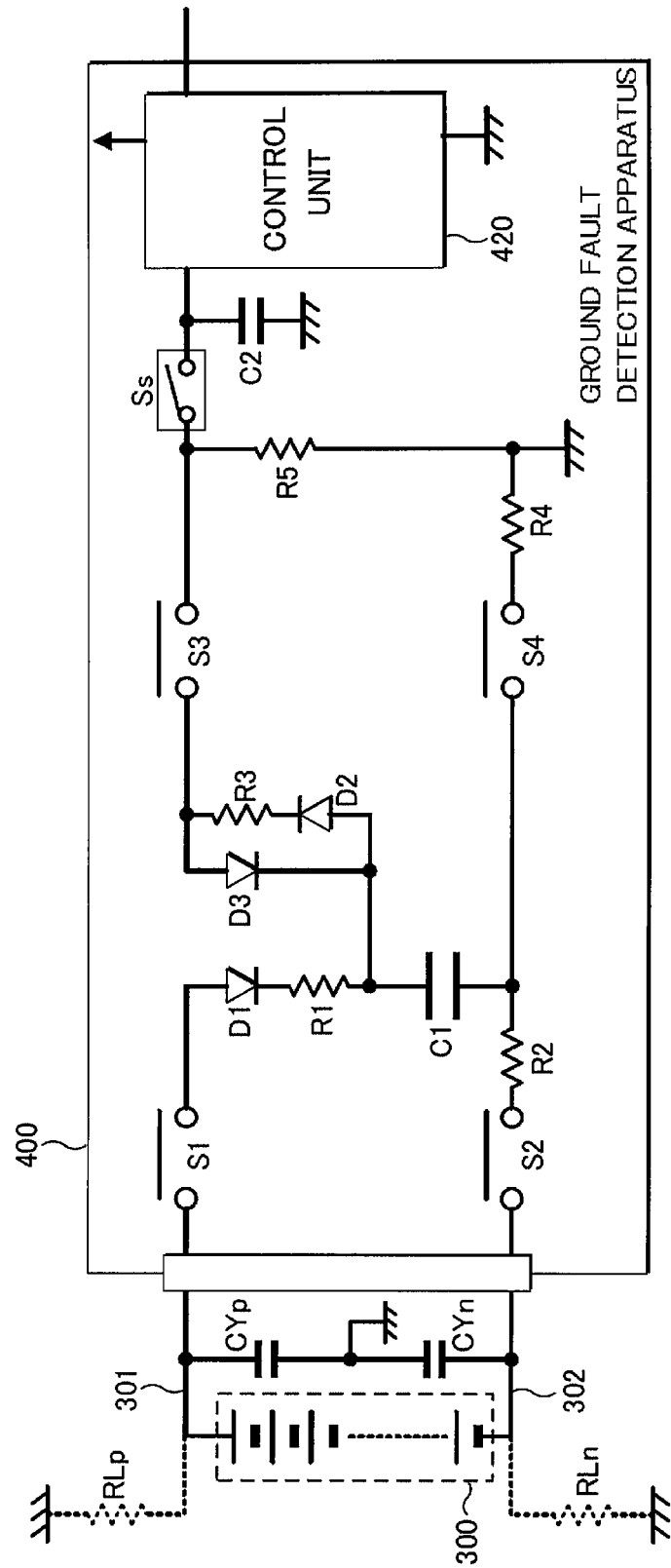
FIG. 11 illustrates an exemplary circuit of a conventional ground fault detection apparatus of a flying capacitor type.

Next, a fourth embodiment of the present invention will be explained. The fourth embodiment is a modified version of the third embodiment, with reduced number of components such as diodes forming the paths for the charging and discharging of the detection capacitor C1. FIG. 10 is a block diagram illustrating a configuration of a ground fault detection apparatus 100c according to a fourth embodiment of the present invention.

In the ground fault detection apparatus 100c according to the fourth embodiment, the positive-electrode-side power supply line 301 is connected to one end of the resistor R1 and to the contact point "a" of the first relay of the bypass twin relay St5. The contact point "b" of the first relay of the bypass twin relay St5 is open, and the contact point "c" of the first relay of the bypass twin relay St5 is connected to the contact point "a" of the first relay of the positive-electrode-side twin relay St3. The contact point "b" of the first relay of the positive-electrode-side twin relay St3 is open, and the contact point "c" of the first relay of the positive-electrode-side twin relay St3 is connected to a ground via the positive-electrode-side bypass resistor Ra.

The other end of the resistor R1 is connected to the contact point "a" of the second relay of the positive-electrode-side twin relay St3. The contact point "b" of the second relay of the positive-electrode-side twin relay St3 is connected to the switch Ss and to one end of the resistor R5. The other end of the resistor R5 is grounded. The contact point "c" of the second relay of the positive-electrode-side twin relay St3 is connected to the positive electrode plate of the detection capacitor C1 via the parallel paths which are constituted of the path including the forward diode and the resistor R0.

The negative-electrode-side power supply line 302 is connected to one end of the resistor R2 and to the contact point "a" of the second relay of the bypass twin relay St5. The contact point "b" of the second relay of the bypass twin relay St5 is open, and the contact point "c" of the second relay of the bypass twin relay St5 is connected to the contact point "a" of the first relay of the negative-electrode-side twin relay St4. The contact point "b" of the first relay of the negative-electrode-side twin relay St4 is open, and the contact point "c" of the first relay of the negative-electrode-side twin relay St4 is grounded via the negative-electrode-side bypass resistor Rb.

The other end of the of the resistor R2 is connected to the contact point "a" of the second relay of the negative-electrode-side twin relay St4. The contact point "b" of the second relay of the negative-electrode-side twin relay St4 is grounded via the resistor R4. The contact point "c" of the second relay of the negative-electrode-side twin relay St4 is connected to the negative electrode plate of the detection capacitor C1.

In the fourth embodiment, the ground fault determination procedures and the switching operation for the measurements of the charge voltage Vp, the charge voltage Vn, the charge voltage Vpp and the charge voltage Vnn are the same as the third embodiment.

LIST OF REFERENCE SIGNS 100 ground fault detection apparatus
120 control unit
300 high-voltage battery
301 positive-electrode-side power supply line
302 negative-electrode-side power supply line
C1 detection capacitor
CYp, CYn Y capacitor
Ra positive-electrode-side bypass resistor
Rb negative-electrode-side bypass resistor
Risn negative-electrode-side termination resistor
Risp positive-electrode-side termination resistor
S1 positive-electrode-side charge/discharge switch
S2 negative-electrode-side charge/discharge switch
Sa positive-electrode-side bypass switch
Sb negative-electrode-side bypass switch
St1 positive-electrode-side charge/discharge twin relay
St2 negative-electrode-side charge/discharge twin relay
St3 positive-electrode-side twin relay
St4 negative-electrode-side twin relay
St5 bypass twin relay
Sta positive-electrode-side bypass twin relay
Stb negative-electrode-side bypass twin relay

What is claimed is:

1. A ground fault detection apparatus connected to a high-voltage battery and configured to detect lowering of insulation resistance of a system provided with the high-voltage battery, the ground fault detection apparatus comprising:
   (a) a detection capacitor which operates as a flying capacitor;
   (b) a positive-electrode-side termination resistor connecting a positive-electrode side of the high-voltage battery and a ground;
   (c) a negative-electrode-side termination resistor connecting a negative-electrode side of the high-voltage battery and the ground;
   (d) a positive-electrode-side bypass resistor having one end connected to the ground;
   (e) a negative-electrode-side bypass resistor having one end connected to the ground;
   (f) a positive-electrode-side Form C contact point switch configured to alternatively switch a connection destination of a first end of the detection capacitor between the positive-electrode side of the high-voltage battery and the ground side;
   (g) a negative-electrode-side Form C contact point switch configured to alternatively switch a connection destination of a second end of the detection capacitor between the negative-electrode side of the high-voltage battery and the ground side;
(h) a positive-electrode-side bypass switch configured to switch a state of connection between the positive-electrode side of the high-voltage battery and the positive-electrode-side bypass resistor;
(i) a negative-electrode-side bypass switch configured to switch a state of connection between the negative-electrode side of the high-voltage battery and the negative-electrode-side bypass resistor; and
(j) a control unit,
wherein the control unit is configured to:
compare a first charge voltage (Vp) of the detection capacitor with a second charge voltage (Vn) of the detection capacitor, the first charge voltage (Vp) being obtained when the detection capacitor is fully charged under a condition where (i) the positive-electrode-side Form C contact point switch is switched to the positive-electrode side of the high-voltage battery, (ii) the negative-electrode-side Form C contact point switch is switched to the ground side, and (iii) the positive-electrode-side bypass switch and the negative-electrode-side bypass switch are in a non-connecting state, and the second charge voltage (Vn) being obtained when the detection capacitor is fully charged under a condition where (i) the positive-electrode-side Form C contact point switch is switched to the ground side, (ii) the negative-electrode-side Form C contact point switch is switched to the negative-electrode side of the high-voltage battery, and (iii) the positive-electrode-side bypass switch and the negative-electrode-side bypass switch are in the non-connecting state; and
determine that the insulation resistance on the positive-electrode side is lowered when the first charge voltage (Vp) is smaller and when degree of the smallness of the first charge voltage (Vp) is greater than a predetermined reference, or determine that the insulation resistance on the negative-electrode side is lowered when the second charge voltage (Vn) is smaller and when degree of the smallness of the second charge voltage (Vn) is greater than a predetermined reference.

2. The ground fault detection apparatus according to claim 1, wherein the control unit is configured to:
when the degree of the smallness of the first charge voltage (Vp) or the second charge voltage (Vn), whichever is smaller, is not greater than the predetermined reference, measure a third charge voltage (Vpp) of the detection capacitor or a fourth charge voltage (Vnn) of the detection capacitor, the third charge voltage (Vpp) being obtained when the detection capacitor is fully charged under a condition where (i) the positive-electrode-side Form C contact point switch is switched to the positive-electrode side of the high-voltage battery, (ii) the negative-electrode-side Form C contact point switch is switched to the ground side, (iii) the positive-electrode-side bypass switch is in the non-connecting state, and (iv) the negative-electrode-side bypass switch is in a connecting state, and the fourth charge voltage (Vnn) being obtained when the detection capacitor is fully charged under a condition where (i) the positive-electrode-side Form C contact point switch is switched to the ground side, (ii) the negative-electrode-side Form C contact point switch is switched to the negative-electrode side of the high-voltage battery, (iii) the positive-electrode-side bypass switch is in a connecting state, and (iv) the negative-electrode-side bypass switch is in the non-connecting state; and, when a ratio of change from the first charge voltage (Vp) to the third charge voltage (Vpp) is smaller than a reference, or when a ratio of change from the second charge voltage (Vn) to the fourth charge voltage (Vnn) is smaller than a reference, determine that the insulation resistance is lowered on both electrodes.

3. The ground fault detection apparatus according to claim 1, wherein the positive-electrode-side Form C contact point switch, the negative-electrode-side Form C contact point switch, the positive-electrode-side bypass switch and the negative-electrode-side bypass switch are constituted of a twin relay.

4. A ground fault detection apparatus connected to a high-voltage battery and configured to detect lowering of insulation resistance of a system provided with the high-voltage battery, the ground fault detection apparatus comprising:
(a) a detection capacitor which operates as a flying capacitor;
(b) a positive-electrode-side termination resistor connecting a positive-electrode side of the high-voltage battery and a ground;
(c) a negative-electrode-side termination resistor connecting a negative-electrode side of the high-voltage battery and the ground;
(d) a positive-electrode-side bypass resistor having one end connected to the ground;
(e) a negative-electrode-side bypass resistor having one end connected to the ground;
(f) a bypass twin relay configured to:
in a first state, make no connection between the positive-electrode side of the high-voltage battery and a predetermined positive-electrode-side connection point, and make no connection between the negative-electrode side of the high-voltage battery and a predetermined negative-electrode-side connection point; and
in a second state, connect between the positive-electrode side of the high-voltage battery and the predetermined positive-electrode-side connection point, and connect between the negative-electrode side of the high-voltage battery and the predetermined negative-electrode-side connection point;
(g) a positive-electrode-side twin relay configured to:
in a first state, connect a first end of the detection capacitor to the positive-electrode side of the high-voltage battery, while making no connection between the predetermined positive-electrode-side connection point and the positive-electrode-side bypass resistor; and
in a second state, connect the first end of the detection capacitor to the ground, and connect the predetermined positive-electrode-side connection point and the positive-electrode-side bypass resistor;
(h) a negative-electrode-side twin relay configured to:
in a first state, connect a second end of the detection capacitor to the negative-electrode side of the high-voltage battery, while making no connection between the predetermined negative-electrode-side connection point and the negative-electrode-side bypass resistor; and
in a second state, connect the second end of the detection capacitor to the ground, and connect the predetermined negative-electrode-side connection point and the negative-electrode-side bypass resistor; and
(i) a control unit,
wherein the control unit is configured to:
compare a first charge voltage (Vp) of the detection capacitor with a second charge voltage (Vn) of the detection capacitor, the first charge voltage (Vp) being obtained when the detection capacitor is fully charged under a condition where (i) the positive-electrode-side twin relay is in the first state, (ii) the negative-electrode-side twin relay is in the second state, and (iii) the bypass twin relay is in the first state, and the second charge voltage (Vn) being obtained when the detection capacitor is fully charged under a condition where (i) the positive-electrode-side twin relay is in the second state, (ii) the negative-electrode-side twin relay is in the first state, and (iii) the bypass twin relay is in the first state; and determine that the insulation resistance on the positive-electrode side is lowered when the first charge voltage (Vp) is smaller and when degree of the smallness of the first charge voltage (Vp) is greater than a predetermined reference, or determine that the insulation resistance on the negative-electrode side is lowered when the second charge voltage (Vn) is smaller and when degree of the smallness of the second charge voltage (Vn) is greater than a predetermined reference.

5. The ground fault detection apparatus according to claim 4, wherein the control unit is configured to:

when the degree of the smallness of the first charge voltage (Vp) or the second charge voltage (Vn), whichever is smaller, is not greater than the predetermined reference, measure a third charge voltage (Vpp) of the detection capacitor or a fourth charge voltage (Vnn) of the detection capacitor, the third charge voltage (Vpp) being obtained when the detection capacitor is fully charged under a condition where (i) the positive-electrode-side twin relay is in the first state, (ii) the negative-electrode-side twin relay is in the second state, and (iii) the bypass twin relay is in the second state, and the fourth charge voltage (Vnn) being obtained when the detection capacitor is fully charged under a condition where (i) the positive-electrode-side twin relay is in the second state, (ii) the negative-electrode-side twin relay is in the first state, and (iii) the bypass twin relay is in the second state; and, when a ratio of change from the first charge voltage (Vp) to the third charge voltage (Vpp) is smaller than a reference, or when a ratio of change from the second charge voltage (Vn) to the fourth charge voltage (Vnn) is smaller than a reference, determine that the insulation resistance is lowered on both electrodes.

6. The ground fault detection apparatus according to claim 5, wherein the control unit is configured to:

when the degree of the smallness of the first charge voltage (Vp) or the second charge voltage (Vn), whichever is smaller, is not greater than the predetermined reference, measure the third charge voltage (Vpp) when the first charge voltage (Vp) is smaller, or measure the fourth charge voltage (Vnn) when the second charge voltage (Vn) is smaller.

7. The ground fault detection apparatus according to claim 2, wherein the positive-electrode-side Form C contact point switch, the negative-electrode-side Form C contact point switch, the positive-electrode-side bypass switch and the negative-electrode-side bypass switch are constituted of a twin relay.

8. The ground fault detection apparatus according to claim 2, wherein the control unit is configured to:

when the degree of the smallness of the first charge voltage (Vp) or the second charge voltage (Vn), whichever is smaller, is not greater than the predetermined reference, measure the third charge voltage (Vpp) when the first charge voltage (Vp) is smaller, or measure the fourth charge voltage (Vnn) when the second charge voltage (Vn) is smaller.

* * * * *